United States Patent
Wada (10) Patent No.: US 6,195,773 B1
(45) Date of Patent: Feb. 27, 2001

(54) LSI DEFECTIVE AUTOMATIC ANALYSIS SYSTEM AND ANALYZING METHOD THEREFOR

(75) Inventor: Shin-ichi Wada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/114,942

(22) Filed: Jul. 14, 1998

(30) Foreign Application Priority Data

Jul. 14, 1997 (JP) .................................................... 9-187090

(51) Int. Cl.⁷ .................................................... G01R 31/28
(52) U.S. Cl. .............................. 714/724; 703/14; 703/22
(58) Field of Search ..................................... 714/724, 733, 714/734, 738, 741, 742, 32, 33, 25, 28, 31, 736, 737; 703/13, 14, 15, 22, 28

(56) References Cited

U.S. PATENT DOCUMENTS

| 5,550,841 | * | 8/1996 | O'Brien .............................. 714/724 |
| 5,640,403 | * | 6/1997 | Ishiyama et al. .................... 714/737 |
| 5,640,539 | | 6/1997 | Goishi et al. . |
| 5,912,901 | * | 6/1999 | Adams et al. ....................... 714/733 |

FOREIGN PATENT DOCUMENTS

| 56-48144 | 5/1981 | (JP) . |
| 5-121946 | 7/1984 | (JP) . |
| 63-124438 | 5/1988 | (JP) . |
| 1-244384 | 9/1989 | (JP) . |
| 4-50777 | 2/1992 | (JP) . |
| 7-92240 | 4/1995 | (JP) . |
| 9-329649 | 12/1997 | (JP) . |

* cited by examiner

Primary Examiner—Christine T. Tu
(74) Attorney, Agent, or Firm—Young & Thompson (57) ABSTRACT

In an LSI defective automatic analysis system disclosed here, a potential measuring means 1 applies a series of test vectors to a designated sample and measures an operating potential of a designated place on a surface of an LSI chip at the moment the test vector of a designated address is applied. A potential estimating means 2 receives another measured potential value already obtained, and estimates, in the same sample, the potential of another place or the potential when another test vector is applied. A potential measurement condition determining means 3 receives the measured potential value and the estimated potential value already obtained, and instructs the LSI sample to be measured, the place to be measured and the test vector address to be used, as the condition for the potential measurement required to search for a defective cause place. An estimation error correcting means 4 receives the measured potential value and the estimated potential value and detects the contradiction between the measured and estimated potential values, and instructs to exclude the related estimated potential value when the contradiction is detected, so that the error of the potential estimation is corrected. A defective cause place deriving means 5 receives the measured potential value and the estimated potential value, and derives a range of candidates of defective cause places in the defective sample. Thus, a cause place of a faulty operation of the LSI is automatically searched for a shortened execution time.

6 Claims, 6 Drawing Sheets

| MEASURED NET | TEST VECTOR ADDRESS | SAMPLE | MEASURED VALUE | NEWLY ESTIMATED VALUE AND ESTIMATION RULE | NET TO BE NOTICED NEXT | INPUT SIDE NET OF NOTICED NET |
|---|---|---|---|---|---|---|
| J | 4850 | NON-DEFECTIVE | J : High | | | |
| J | 4850 | DEFECTIVE | J : Low | → D : High (3) , G : High (3) | J | D, G |
| D | 4850 | NON-DEFECTIVE | D : High | → G : Low (4)** <br> → A : High (3) , F : High (3) | G | F, A |
| F | 4850 | DEFECTIVE | F : Low | | F | C, B, E, G |
| C | 4850 | NON-DEFECTIVE | C : High | | | |
| C | 4850 | DEFECTIVE | C : High | | NOT CHANGE | |
| B | 4850 | NON-DEFECTIVE | B : High | → E : Low (2) | | |
| B | 4850 | DEFECTIVE | B : High | → E : Low (2) | NOT CHANGE | |
| A | 4850 | DEFECTIVE | A : Low | | | A |

( ** Based on D = High and J = High )

Fig. 6

LSI DEFECTIVE AUTOMATIC ANALYSIS SYSTEM AND ANALYZING METHOD THEREFOR

BACKGROUND OF THE INVENTION

1. Field of the Invention

The present invention relates to an LSI defective automatic analysis system and an analyzing method therefor, and a recording medium of storing a program for causing a computer to execute the analyzing method. More specifically, the present invention relates to an LSI defective automatic analysis system configured to automatically search for a defective cause place in an LSI by use of an electron beam, and an analyzing method therefor, and a recording medium of storing a program for causing a computer to execute the analyzing method.

2. Description of Related Art

As one effective means for searching for a defective cause place in an LSI, an electron beam tester has been used. A test signal is applied to an defective LSI in a vacuum chamber by means of an LSI tester, and an electron beam is also irradiated on a surface of the LSI, so that the amount of secondary electrons created as the result of the irradiation of the electron beam is measured. A relative potential can be known on the basis of whether the amount of secondary electrons is large (the potential is relatively low) or small (the potential is relatively high). Furthermore, a system for automatically carrying out a defective cause place search on the basis of this method, has been proposed (Japanese Patent Application Pre-examination Publication No. JP-A-63-124438 (an English abstract of JP-A-63-124438 is available and the content of the English abstract is incorporated by reference in its entirety into this application) and Japanese Patent Application No. Heisei 08-149641 (which was published as Japanese Patent Application Pre-examination Publication JP-A-09-329649; an English abstract of JP-A-09-329649 is available and the content of the English abstract is also incorporated by reference in its entirety into this application).

Particularly, the system proposed by Japanese Patent Application No. Heisei 08-149641 is so constructed that, within a vacuum chamber of an electron beam tester, one of non-defective and defective LSI samples is quickly located on a measuring position by means of an LSI changing and locating mechanism, and a potential measurement is carried out for the located sample, so that a defective cause place is searched for on the basis of the measured potentials of the non-defective and defective samples. Since information of operating potentials in a normal condition, required to search for the defective cause place, is obtained from actual operating potentials of the non-defective samples, it is possible to search for the defective cause place, without information of circuit connection of the LSI to be analyzed, and without information of logical desired values when a test signal is applied, which information was required in the other system. In many cases it is actually difficult to obtain this information. Since this system can be utilized in the many cases, this system has a wide range of application.

The above mentioned system has such a problem that a considerable execution time is required because it is necessary to carry out the potential measurement at many places for non-defective and defective samples in order to search for a defective cause place.

SUMMARY OF THE INVENTION

Accordingly, it is an object of the present invention to provide an LSI defective automatic analysis system which has overcome the above mentioned problem of the prior art and which is capable of searching for a defective cause for a shortened execution time, without circuit connection information of the LSI to be analyzed, and without information of logical desired values when a test signal is applied, and an analyzing method therefor, and a recording medium of storing a program for causing a computer to execute the analyzing method.

According to the present invention, there is provided an LSI defective automatic analysis system including a potential measuring means for applying a series of predetermined test vectors to a designated sample selected from two samples consisting of a non-defective LSI and a defective LSI both based on the same design, and for measuring an operating potential of a designated place on a surface of the LSI chip at the moment a designated test vector is applied; a potential estimating means receiving another measured potential value already obtained, for estimating, in the same sample, the potential of another place or the potential when another test vector is applied; and a potential measurement condition determining means receiving the measured potential value and the estimated potential value already obtained, for instructing the sample to be measured, the place to be measured and the test vector to be applied, as the condition for the potential measurement required to search for a defective cause place.

One embodiment of the LSI defective automatic analysis system further includes an estimation error correcting means receiving the measured potential value and the estimated potential value, for detecting the contradiction between the measured and estimated potential values, and for correcting an error of the related potential estimation when the contradiction is detected; and a defective cause place deriving means receiving the measured potential value and the estimated potential value, for deriving a range of candidates of defective cause places in the defective sample.

According to a second aspect of the present invention, there is provided an LSI defective automatic analysis method including a potential measuring step for applying a series of predetermined test vectors to a designated sample selected from two samples consisting of a non-defective LSI and a defective LSI both based on the same design, and for measuring an operating potential of a designated place on a surface of the LSI chip at the moment a designated test vector is applied; a potential estimating step receiving another measured potential value already obtained, for estimating, in the same sample, the potential of another place or the potential with another test vector is applied; and a potential measurement condition determining step receiving the measured potential value and the estimated potential value already obtained, for instructing the sample to be measured, the place to be measured and the test vector to be applied, as the condition for the potential measurement required to search for a defective cause place.

One embodiment of the LSI defective automatic analysis method further includes an estimation error correcting step receiving the measured potential value and the estimated potential value, for detecting the contradiction between the measured and estimated potential values, and for correcting an error of the related potential estimation when the contradiction is detected; and a defective cause place deriving step receiving the measured potential value and the estimated potential value, for deriving a range of candidates of defective cause places in the defective sample.

According to a third aspect of the present invention, there is provided a recording medium storing a program for causing a computer to execute a potential measuring step for applying a series of predetermined test vectors to a designated sample selected from two samples consisting of a non-defective LSI and a defective LSI both based on the same design, and for measuring an operating potential of a designated place on a surface of the LSI chip at the moment a designated test vector is applied; a potential estimating step receiving another measured potential value already obtained, for estimating, in the same sample, the potential of another place or the potential with another test vector is applied; and a potential measurement condition determining step receiving the measured potential value and the estimated potential value already obtained, for instructing the sample to be measured, the place to be measured and the test vector to be applied, as the condition for the potential measurement required to search for a defective cause place.

With the above mentioned arrangement, in the system in accordance with the present invention, a potential is estimated concerning a place or a vector in which a potential can be estimated from another measured potential value, and then, the defective cause searching is executed without actually carrying the measurement of the potential. Therefore, a total execution time can be reduced. When the potential is estimated for an area related to the defective cause place, there is a case that an erroneous estimated potential value different from the actual potential is obtained. In this case, contradiction occurs between the estimated potential value and the estimated potential value thus derived. The contradiction is detected by the estimation error correcting means, and the potential estimation is corrected by the estimation error correcting means. On the basis of the estimated potential value corrected and the measured potential value, the range of candidates of defective cause places in the defective sample is indicated by the defective cause place deriving means.

DESCRIPTION OF THE PREFERRED EMBODIMENTS

An embodiment of the present invention will be described in detail with reference to the drawings.

Figure 1:
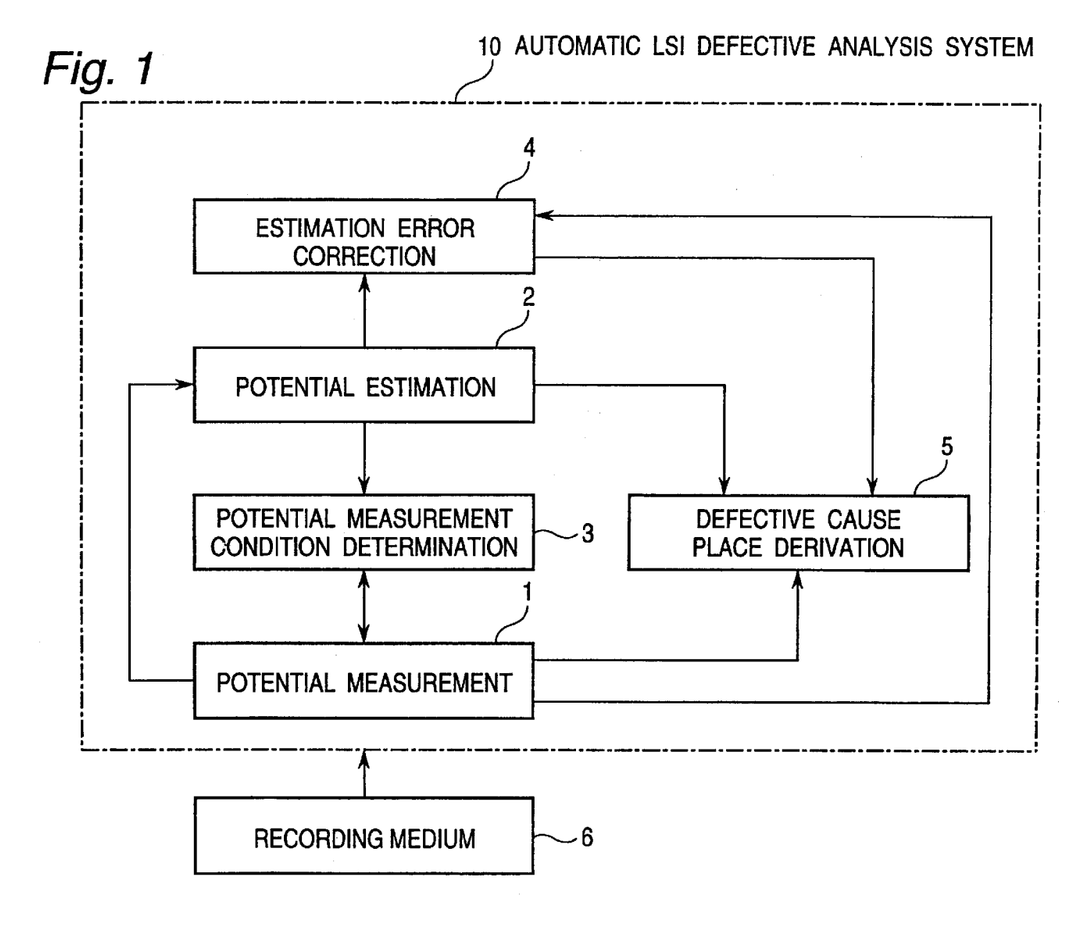
FIG. 1 is a diagram for illustrating an embodiment of the present invention.

FIG. 1 is a diagram for illustrating an embodiment of the LSI defective automatic analysis system in accordance with the present invention. The shown LSI defective automatic analysis system 10 includes a potential measuring means 1 for applying a predetermined series of test vectors for a designated sample selected from two samples consisting of a non-defective LSI and a defective LSI both based on the same design, and for measuring and discriminating an operating potential at a designated place on a surface of the LSI chip at the moment a designated test vector is applied, a potential estimating means 2 receiving another measured potential value already obtained, for estimating, in the same sample, a potential at another place or a potential when another test vector is applied, and a potential measurement condition determining means 3 receiving the measured potential values and the estimated potential value already obtained, for determining and indicating a sample to be measured, a place to be measured and a test vector to be applied, as a potential measurement condition required to search for a defective place. The shown LSI defective automatic analysis system also includes an estimation error correcting means 4 receiving the measured potential value and the estimated potential value, for detecting contradiction therebetween and for correcting an error in the related potential estimation when the contradiction is detected, and a defective cause place deriving means 5 receiving the measured potential value and the estimated potential value, for deriving a range of candidates of defective cause places in a defective sample. In addition, the shown LSI defective automatic analysis system 10 is connected to a recording medium 6.

Figure 2:
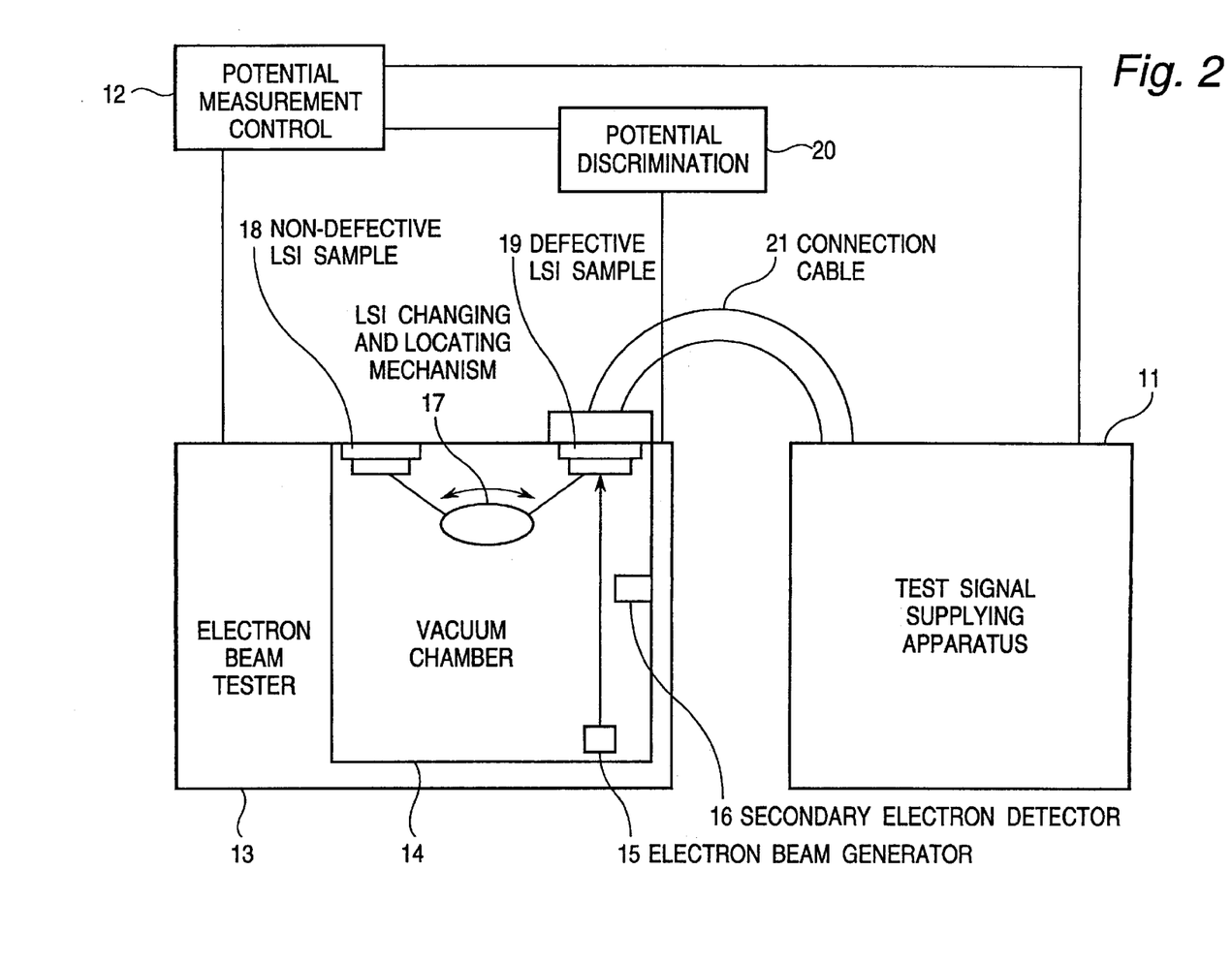
FIG. 2 is a diagram for illustrating a method for searching for a defective cause in a potential measuring and controlling mechanism and for indicating a defective cause candidate.

In FIG. 1, for the designated sample, the potential measuring means 1 measures and discriminates the operating potential at the designated place on the surface of the LSI chip at the moment the test vector at a designated address is applied. A specific construction of this means is shown in FIG. 2.

A test signal supplying apparatus 11 has a function of generating a series of test vectors making a defective LSI cause a faulty operation, and is constructed to be controlled by a potential measurement controller 12. It is preferred to use an LSI tester which internally includes a memory recording the series of test vectors and which has a mechanism for generating a registered series of test vectors as test signals.

Incidentally, the series of test vectors are a plurality of sets of previously prepared testing patterns of combination of "1" and "0" (generally, a few ten thousand sets to a few hundred thousand sets), and are so configured that a test vector is designated and applied to an LSI to be tested, serially in a time sequence, by designating an address.

An electron beam tester 13 comprises an electron beam generator 15 and a secondary electron detector 16 located in a vacuum chamber 14.

An electron beam generated by the electron beam generator 15 is irradiated on a sample LSI 18 or 19 located at a measurement position by an LSI changing and locating mechanism 17, and the amount of secondary electrons is measured. The electron beam tester 13 is so constructed that an operation can be controlled by another instrument, and the LSI changing and locating mechanism 17 can be incorporated within the vacuum chamber 14.

The LSI changing and locating mechanism 17 selects one of the two LSIs 18 and 19 in the vacuum chamber 14 to locate the selected LSI on the measurement position, under the control of the potential measurement controller 12. A test signal is electrically connected to the LSI located on the measurement position, from the test signal supplying apparatus 11.

For the measurement of the potential, it is sufficient if the electron beam is raster-scanned within a two-dimensional area including a designated place by use of the electron beam tester 13 when a designated test vector address is applied, so that a potential profile in the two-dimensional area is generated and if a gradation level of a portion, within the potential profile, corresponding to the designated place, is read out by a potential discriminator 20 so as to discriminate the potential. In the case of a logic LSI, it is sufficient if there is discriminated which of "high" or "low" is the potential.

In place of obtaining the potential profile, it is possible to obtain, by means of the electron beam tester 13, a potential waveform at a designated place during a period over a plurality of test vector addresses including the designated test vector address, and to read out the gradation level at the timing corresponding to the designated vector address, by means of the potential discriminator 20, so as to discriminate the potential. These operations are controlled by the potential measurement controller 12.

For the purpose of measuring the potential at the designated place of the designated LSI sample at the designated test vector address, the potential measurement controller 12 controls the test signal supplying apparatus 11, the electron beam tester 13, the LSI changing and locating mechanism 17 and the potential discriminator 20, so as to control a necessary potential measurement. With this arrangement, the potential measuring means 1 can measure and discriminate the potential at the designated place of the designated sample at the designated test vector address.

The potential estimating means 2 receives another measured potential value already obtained, and estimates, in the same sample, a potential at another place or a potential at another test vector address. As regards an internal function of the LSI, it is sufficient if a net list showing the connection relation of transistors is derived, by means of a CAD (computer aided design) tool of the LSI, from the layout data of the LSI to be tested, before the testing or if necessary in the course of the testing. By referring to the net list, it is possible to estimate the potential of another net from the known measured potential value. The estimation of the potential can be performed on the basis of the following estimation rule.

(1) If there exists a path passing from a net through a source and a drain of p-channel transistor(s) to a power supply voltage Vdd, and if a gate potential of all the p-channel transistor(s) on the path is "low", the potential of the net concerned is "high";

(2) If there exists a path passing, from a net through a source and a drain of n-channel transistors) to the ground potential GND, and if a gate potential of all the n-channel transistor(s) on the path is "high", the potential of the net concerned is "low";

(3) If the potential of a net is "low", in a path passing from that net through a source and a drain of p-channel transistor(s) to a power supply voltage Vdd, the gate potential of at least one of the p-channel transistor(s) is "high"; and (4) If the potential of a net is "high"; in a path passing from that net through a source and a drain of n-channel transistor(s) to the ground, the gate potential of at least one of the n-channel transistor(s) is "low".

However, if there are a path extending from the net concerned to the power supply voltage Vdd and another path extending from the net concerned to the ground, and if there is possibility that the gate potential of all p-channel or n-channel transistor(s) in both the paths are simultaneously brought to the "low" level or the "high" level, since there is possibility that the estimation of the potential of the net concerned is mistaken, the estimated value is not derived.

Figure 3:
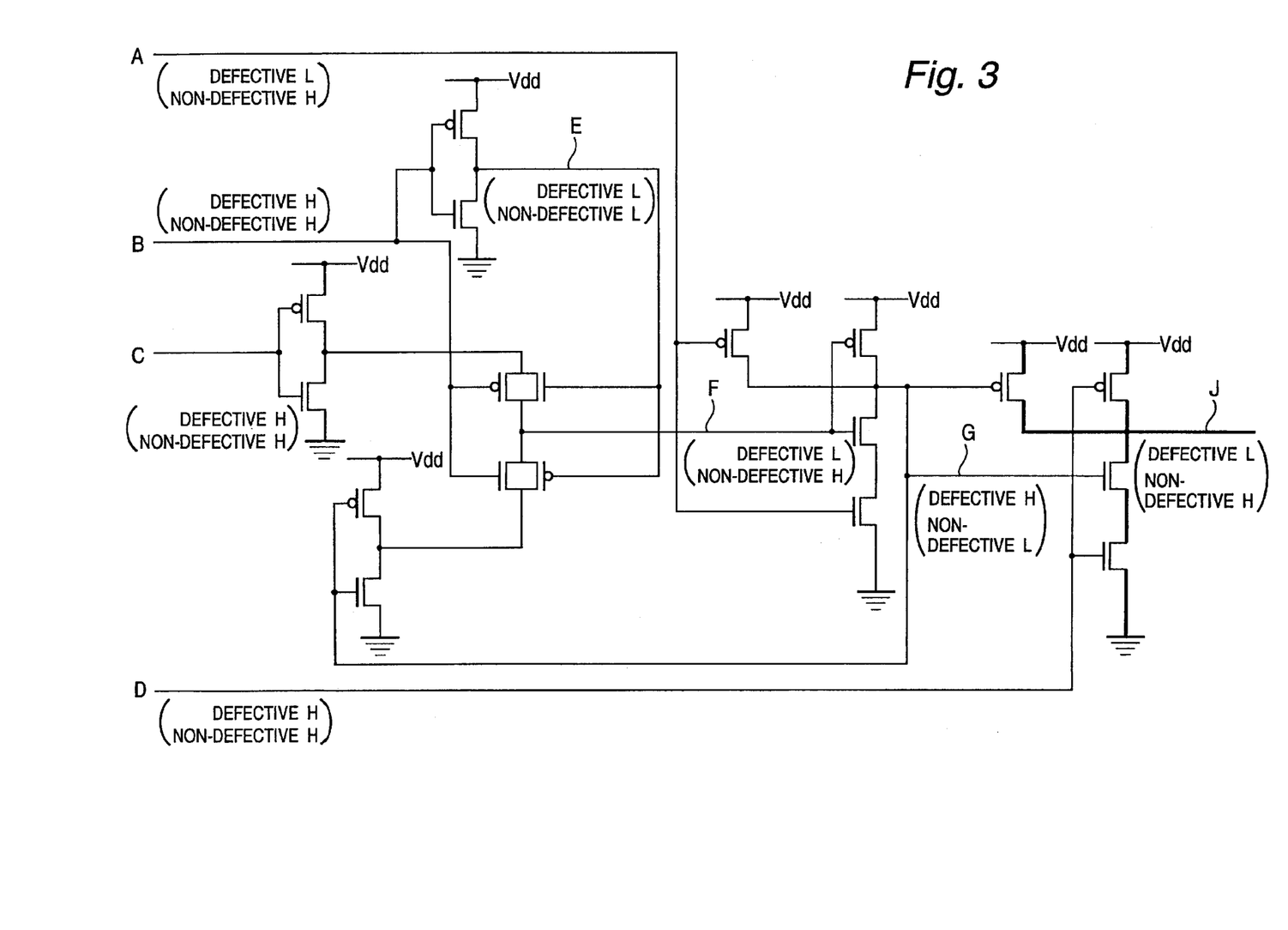
FIG. 3 is a diagram for illustrating a portion of a circuit example of the LSI.

Based on these estimation rules, for example, if the potential of a net G in FIG. 3 is known as being "low", it can be estimated from the rule (1) that the potential of a net J downstream of the net G is "high" and it can be also estimated from the rule (3) that the potential of nets A and F at an input side of the net G are "high".

The potential measurement condition determining means 3 receives the measured potential value and the estimated potential value already obtained, and determines and indicates a sample to be measured, a place to be measured and a test vector address to be applied, as a potential measurement condition required to search for a defective place, on the basis of the measured potential value and the estimated potential value already obtained. When the test vector is applied to the defective LSI, an abnormal potential (which is different from that in the non-defective LSI) occurs in the proximity of a defective cause place at a certain address, so that the abnormal potential spatially propagates to various places, and further, is held in a register and/or a latch. The abnormal potential held in the register and/or the latch propagates at an address later in time so as to become appeared and observed on an output terminal. Thus, the defective cause place can be searched for by reversely tracing back the path in which the abnormal potential has propagated, from the abnormal output terminal, namely, by searching for the place in which the potential is different between the non-defective sample and the defective sample, while tracing toward an input side.

Figure 4:
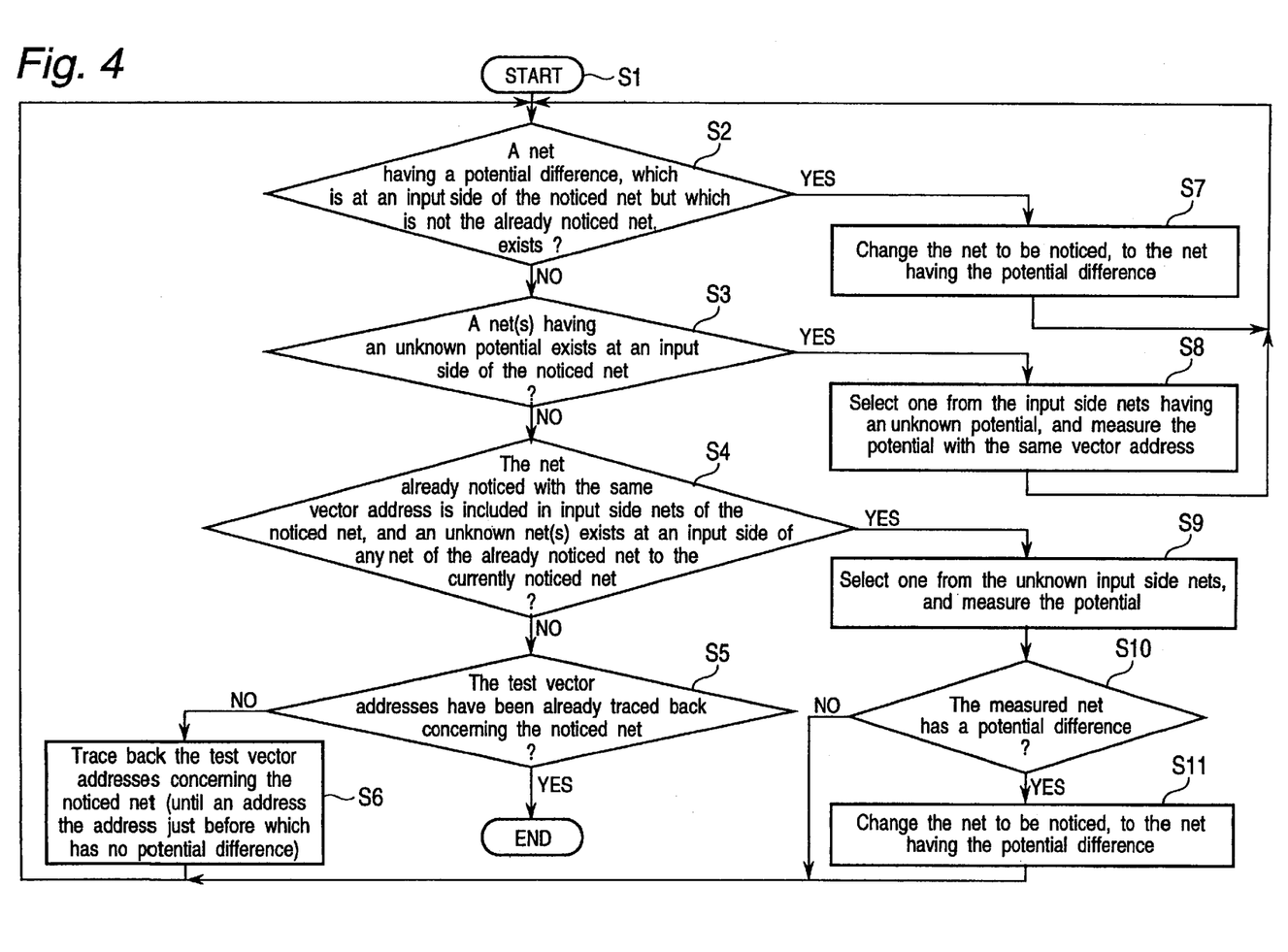
FIG. 4 is a flow chart illustrating an operation of the potential measurement condition determining means 3.

One of methods for searching for the defective cause place is shown in FIG. 4. The processing is started by assuming the abnormal output terminal as the net to be noticed, and the net to be noticed is changed to another net toward an input side along the defective propagating path. In FIG. 4, "a potential difference" or "no potential difference" means that the respective measured potential values or estimated potential values of the "high" or "low" level obtained for the non-defective sample and the defective sample are different or consistent.

The method shown in FIG. 4 is so configured that, of the nets in which there is a potential difference between the non-defective sample and the defective sample, the most upstream net is considered to be a net to be noticed, and of input side nets of the net to be noticed, a net having an unknown potential in the non-defective sample or the defective sample, is selected as a net for which a potential is to be measured next, so that it is urged to actually measure the potential for the sample having the unknown potential.

Here, the input side net of the net concerned indicates a net connected to a gate of individual transistors existing in the path passing from the net concerned through a source-drain of a transistor or transistors to the power supply voltage Vdd or the ground GND. In the example shown in FIG. 3, the path passing from the net J to the power supply voltage Vdd and the ground GND is indicated with a thick solid line. Transistor gates G and D are the input side net of the net J. Nets B, C, E and G are the input side net of the net F.

It is in some case that the signal flow forms a closed loop. In order to comply with such a case, the history of the noticed net is recorded and used. When the signal flow forms the closed loop, if the net to be noticed was simply changed to a net having a potential difference at the input side of the noticed net, the changing of the net to be noticed enters into a closed loop. Therefore, as the condition for the net which should be selected as the net to be noticed, the condition that the net has not yet become the net to be noticed in the same test vector address, is added to the condition that the net has a potential difference.

When the input side nets of the noticed net include the net which has already been noticed in the same test vector address (namely, when the loop is just ready to be closed), a net having an unknown potential is found out among input side nets of a train of the noticed nets from the first noticed net to the currently noticed net, and the potential of the found-out net is determined. When there is no net fulfilling this condition, it is instructed to trace back the test vector address.

In the example shown in FIG. 4, the processing is started from a step S1 under the condition that the abnormal output terminal is considered to be net to be noticed. In a step 2, if an input side net has a potential difference but if the input side net is not the already noticed net, the process goes to a step S7 in which the input side net is selected as the net to be noticed next. When the measurement is carried out for the input side net of the currently noticed net, the test vector address is not changed so that the measurement is carried out with the same test vector address. In a step S3, if a net or nets having an unknown potential exist at the input side of the currently noticed net, the process goes to a step S8 in which, one net is selected from the nets having the unknown potential, and the potential of the selected net is measured with the same vector address In a step 4, whether or not the net to be noticed is ready to complete a closed loop, is ascertained. When the condition of the step 4 is satisfied, namely, when the closed loop is just ready to be completed, the process goes to a step S9 in which one unknown input side net is selected, and the potential of the selected unknown input side net is measured. If the selected and measured input side net has a potential difference, the net to be noticed is changed to the net having the potential difference (steps S10 and S11).

When the condition of the step 4 is not satisfied, the process goes to a step S5 in which, whether or not the test vector address has been traced back in connection with the noticed net, is ascertained. If the test vector address has not yet been traced back, the process goes to a step S6 in which the test vector address is traced back. Namely, whether or not a potential difference exists between the non-defective sample and the defective sample is ascertained while tracing back the test vector address, for the purpose of finding out the test vector address at which a potential difference exists but at the test vector just before which no potential difference exists.

Figure 5:
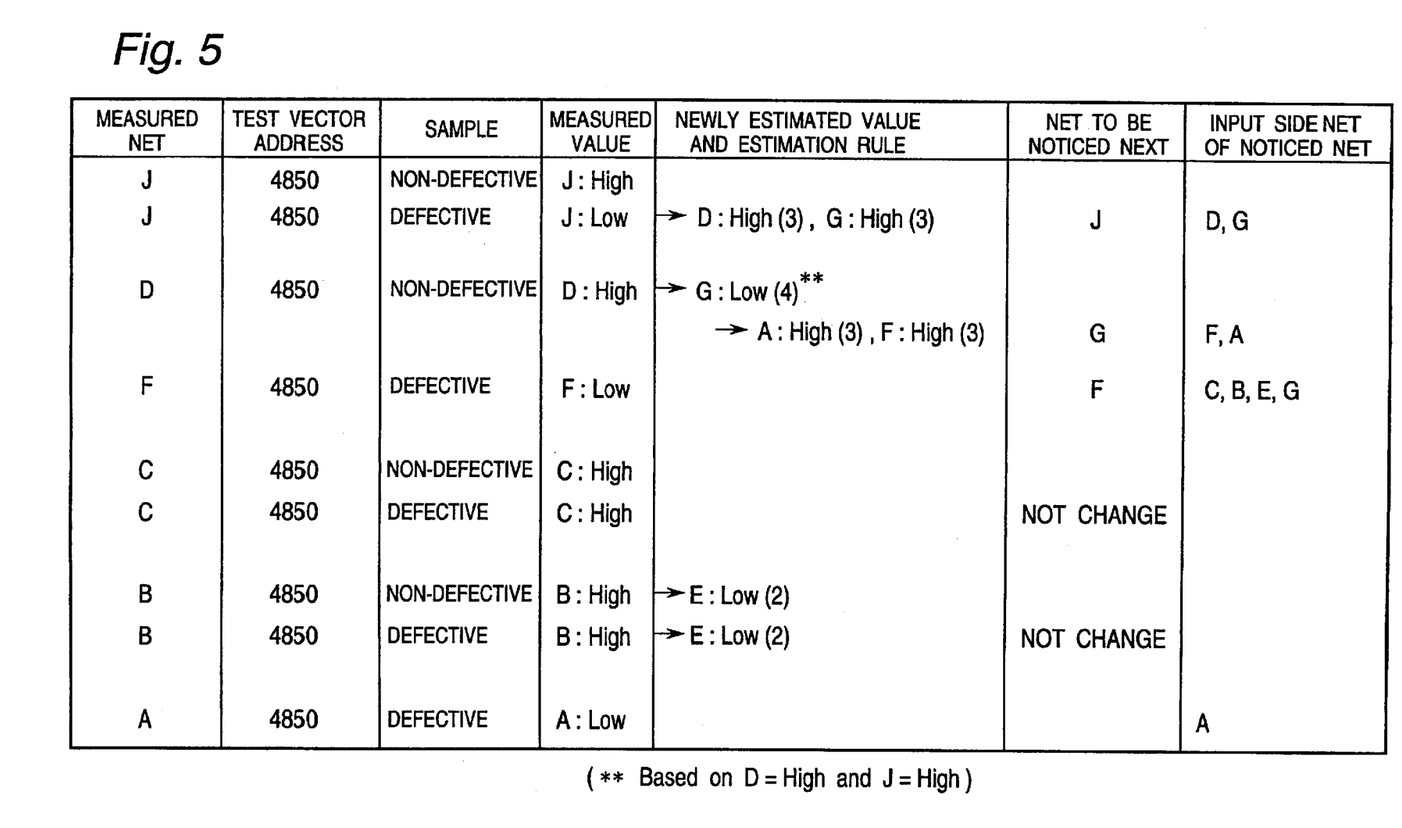
FIG. 5 is a diagram illustrating an example of tracing a defective transmission path in the circuit shown in FIG. 3.

An example of tracing the defective propagating path in the net list having the connection relationship shown in FIG. 3, is shown in FIG. 5. In FIG. 3, actual potentials of the non-defective sample and the defective sample at a test vector address are described for each of nets. FIG. 5 shows the measured potential value, the estimated potential value and the changing of the net to be noticed, in the case that the measurement of the potential is started from the net J.

In first three steps, the input side net of the noticed net is measured, and the net to be noticed is changed to the net having a potential difference, with the result that the net to be noticed is changed from the net J, to the net G, and then to the net F. In each of the steps, the potential is estimated, and the estimated value is utilized. In the step in which the step to be noticed is changed to the net F, since the already noticed net G is included in the input side nets, the net to be noticed is just ready to close a loop.

In this case, even if the net G has a potential difference, the net to be noticed is in no way changed to the net G, and unknown input side nets C, B and E are searched. In the shown example, if it is known that none of nets C, B and E has a potential difference, an unknown input side net A of the series of noticed nets G and F after the already noticed net G is searched. As a result, it is found out that there is a potential difference, and therefore, the processing escapes from the loop.

With the above mentioned arrangement, it is possible to trace back the faulty signal propagating path by estimating the potential at a place where the potential can be estimated, and therefore by actually measuring the potential at only a place(s) where it is necessary to measure the potential, resulting in reaching the defective cause place.

However, when the potential related to the defective cause place is estimated, there is possibility that the potential is erroneously estimated as a faulty potential is propagated from a place at an input side of the defective cause place, and therefore, a further input side of the defective cause place is traced back. For avoiding this situation, there are used (a) the estimation error correcting means 4 receiving the measured potential value and the estimated potential value, for detecting contradiction therebetween and for correcting an error in the related potential estimation when the contradiction is detected, and (b) the defective cause place deriving means 5 receiving the measured potential value and the estimated potential value, for deriving a range of candidates of defective cause places in the defective sample, so that the corrected value is used as the estimated potential value.

The estimation error correcting means 4 records the history of the potential estimation. Furthermore, when the measured potential values and the estimated potential value are not consistent with each other, and therefore, when the existence of the error is detected, the estimation error correcting means 4 refers to the history of the potential estimation, and corrects the error in the potential estimation by instructing to exclude the related estimated potential values.

When the estimated potential value is derived by the potential estimating means 2, the estimation error correcting means 4 records, as the history, the relation between the conclusion and the ground of the potential estimation. The ground of the potential estimation includes the measured potential value and the estimated potential value used for deriving the conclusion, and the assumption of the correctness of the estimation. These factors are recorded as the ground of the potential estimation.

When an estimated potential value is not consistent with another separately derived estimated potential value or a measured potential value, obtained for the same place of the same sample with the same vector, it is detected as the contradiction. As regards the contradiction, the conclusion meaning the existence of the contradiction and the relation between the estimated potential value and/or the measured potential value, becoming the ground for the conclusion, are recorded. Namely, it is meant that the estimation includes any error. In this case, for correcting the error, the following procedure is executed.

(1) A processing in which for an inconsistent estimated potential value, the ground for deriving the estimated potential value is sought from the history of the potential estimation, and if another estimated potential value is used in the process for deriving the first estimated potential value, the ground for deriving the second estimated potential value is sought, is repeated until any estimated potential value is no longer included. The assumptions of the correctness of the estimation included in a series of estimated potential value deriving processes are listed up.

(2) Of the assumptions of the correctness of the estimation obtained in the step (1), one is selected, and it is instructed to exclude the selected assumption of the correctness of the estimation. In addition, it is also instructed to exclude the estimated potential value derived by using the excluded assumption of the correctness of the estimation as the ground for deriving the estimated potential value. (3)

Although the step (2) is completed, if a consistency has not yet been obtained between the estimated potential value and the measured potential value, namely, if there is still an error, the step (1) is further executed.

In the above mentioned processing, it is possible to exclude the assumption of the correctness of the potential estimation which is a cause of the error, and the estimated potential value derived by using the assumption of the correctness of the potential estimation, and the contradiction.

Figure 6:
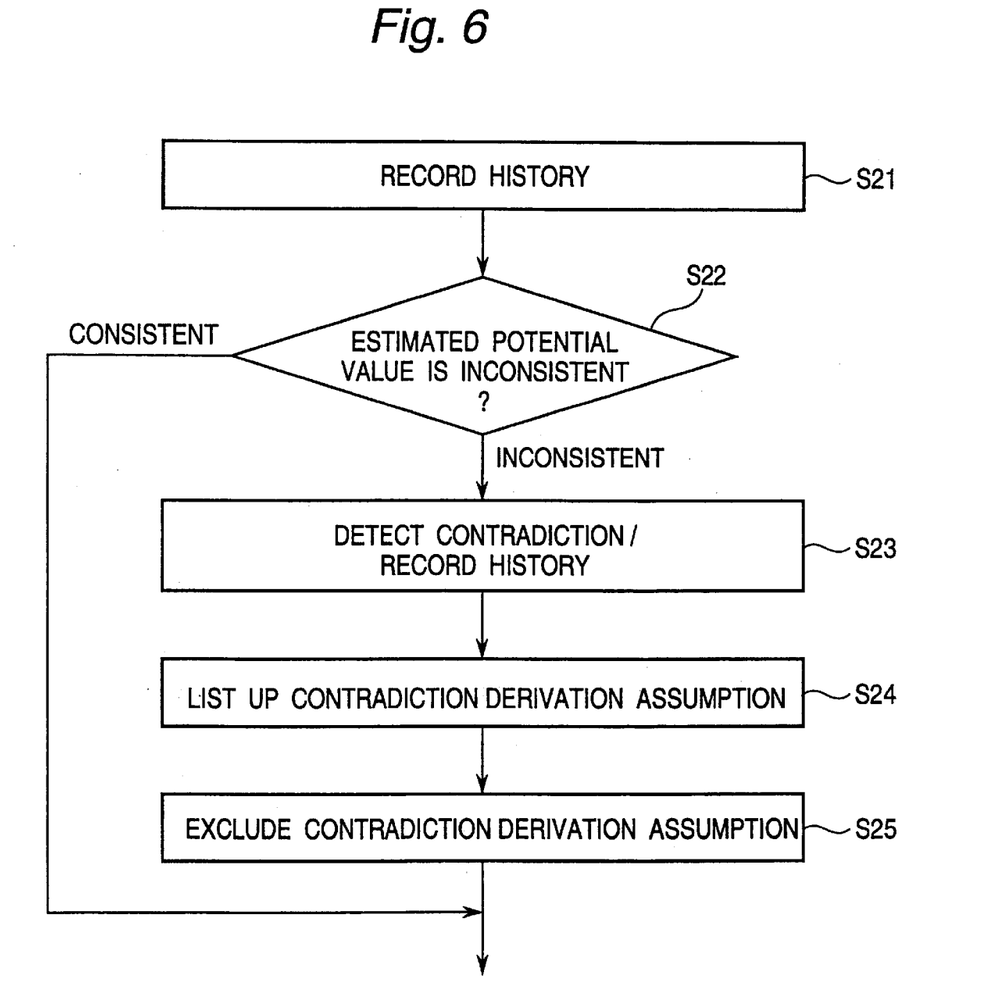
FIG. 6 is a flow chart illustrating an operation of the estimation error correcting means 4.

FIG. 6 is a flow chart illustrating an operation of the estimation error correcting means 4. This means 4 records the history of the potential estimation, and further, when the measured potential values and the estimated potential value are not consistent with each other, and therefore, when the existence of the error is detected, the estimation error correcting means 4 refers to the history of the potential estimation, and corrects the error in the potential estimation by instructing to exclude the related estimated potential value. Furthermore, at each time a new estimated potential value is derived by the potential estimating means, and at each time a new measured potential value is obtained by the potential measuring means, the following processing is executed by the estimation error correcting means (FIG. 6).

In the recording of the history in a step 21, the conclusion of the potential estimation/measurement and the relation between the conclusion and the ground are recorded as the history of the potential estimation and driving/potential measurement. The estimated or measured sample, the test vector address, the net, the estimated or measured potential value are recorded as the conclusion of the potential estimation/measurement. The measured potential value and/or the estimated potential value, and the assumption of the correctness of the estimation, used for deriving the conclusion, are recorded as the ground for the estimation. For example, with a test vector address 8749 in a defective sample, when the potential of the net A is measured as being "high", the history is recorded as follows:

(defective, net A, vector 8749: H)←

Similarly, when the potential of the net C and the net D is measured as being "low", the history is recorded as follows:

(defective, net C, vector 8749: L)←
(defective, net D, vector 8749: L)←

Furthermore, with the test vector address 8749 in the defective sample, since the net C is "low" and the net D is "low", if the potential of the net A is estimated to be "high", the history is recorded adding the assumption of the estimation, as follows:

(defective, net A, vector 8749: H)←
  (defective, net C, vector 8749: L),
  (defective, net D, vector 8749: L), (assumption 001)

In a step S22 for detecting inconsistency of the estimated potential value, the processing is executed to ascertain whether or not the derived estimated potential value is consistent with another separately derived estimated potential value or measured potential value for the same place of the same sample with the same vector. Only when it is not consistent, the following process (step S23 and succeeding steps) are executed.

In the processing of a step S23 for detecting the contradiction and for recording the history, the contradiction is detected, and the relation between the contradiction and the ground for the contradiction is recorded as the history of the derivation of the contradiction. As the ground for the contradiction, the inconsistent estimated potential value(s) and/or measured potential value(s) are recorded. For example, when the results of the estimation and the measurement exemplified in connection with the step S21 are already obtained, an operation will be described under the situation that the potential measurement and estimation expressed by the following history have been executed in the defective sample with the same test vector address:

(potential measurement)
  (defective, net E, vector 8749: H)←
(potential estimation)
  (defective, net A, vector 8749: L)←
    (defective, net B, vector 8749: H),
    (defective, net E, vector 8749: H), (assumption 002)

In this situation, since this newly obtained estimated potential value is inconsistent with the estimated potential value exemplified in the step 21 in connection with the net A, the contradiction is detected. As the inconsistent estimated potential value and measured potential value, the following history is generated:

(contradiction)←(defective, net A, vector 8749: H),
  (defective, net A, vector 8749: L)

In the processing of a step S24 for listing up the contradiction deriving assumption, the history is traced from the contradiction, and the assumption becoming the ground of the contradiction is found out. Furthermore, the ground for deriving the contradiction is found out from the history of the derivation of the contradiction, and the ground for deriving the estimated potential value included in the ground for deriving the contradiction is found out. This processing is repeated until a estimated potential value is no longer included. The assumptions of the correctness of the potential estimation thus obtained are listed up. In the case of the contradiction exemplified in the step S23, if the assumptions of the correctness of the potential estimation are listed up in the process of tracing back the grounds, the assumption 001 and the assumption 002 are listed up.

In the processing of a step S25 for excluding the assumption, one is selected from the assumptions of the correctness of the potential estimation listed up in the step S24, and it is instructed to exclude the selected assumption. Furthermore, it is also instructed to exclude the estimated potential value derived by using the selected assumption as only one ground and the contradiction generated by using the selected assumption as only one ground. If the assumption 002 is excluded from the assumptions listed up in the example of the step S24, the following estimated potential value derived by using the same assumption and the contradiction generated by using the same assumption, are excluded.

(defective, net B, vector 8749: H)
(defective, net A, vector 8749: L)
(contradiction)

Thus, the contradictory condition is dissolved.

In the above mentioned process, when the estimated potential value is inconsistent with, it is detected as the contradiction. The ground of the contradiction is traced back, and the assumption of the correctness becoming the cause of the contradiction is excluded, so that the contradictory condition is dissolved, and the error can be corrected.

The estimated potential value excluded by the above process is treated as the excluded estimated potential value no longer exists in the potential estimating means, the potential measurement condition determining means and the defective cause place deriving means. With this treatment, the assumption of the correctness of the potential estimation, becoming the ground of the error, and the estimated potential value derived by using the same assumption and the contradiction generated by using the same assumption, are excluded.

If an not-erroneous assumption is actually excluded for excluding the contradiction in the step of the S25, contradiction occurs among other estimated potential values, or contradiction will occur among measured potential values and/or estimated potential values at a later stage. As a result, an erroneous assumption is finally excluded.

On the basis of the measured potential values and the estimated potential values which have been already obtained, when the potential of some input side net is different between the non-defective sample and the defective sample, the defective cause place deriving means 5 can derive the proximity of the input side net as being a defective cause place.

Namely, the defective cause place deriving means 5 identifies the defective cause place on the basis of the operation of the potential measurement condition determining means 3, the measured potential values and the estimated potential values. Of a series of nets which have been handled as being the net to be noticed, by the potential measurement condition determining means 3, and which have a potential difference between the non-defective sample and the defective sample, the last noticed net is found out, and the proximity of the last noticed net is pointed out as the defective cause place.

Next, an operation of the embodiment of the present invention will be described. Under the instructions from the potential measurement condition determining means 3, the potential measuring means 1 measures the potential of a designated place of a designated sample with a designated test vector address. On the basis of the measured potential value of the designated sample obtained by the potential measuring means 1, the potential estimating means 2 estimates, in the same sample, the potential of another place and the potential with another test vector address.

On the basis of the measured potential values and the estimated potential values of the non-defective sample and the defective sample, the potential measurement condition determining means 3 derives the sample, the place and the test vector address, requiring the potential measurement in order to search for a defective cause place of the defective sample, and instructs these derived parameters to the potential measuring means 1. This operation is repeated by starting from an abnormal output terminal. Thus, it is possible to trace back the abnormality propagating path, so as to reach the defective cause place.

Particularly, since the potential estimating means 2 estimates the potential of relating places on the basis of the measured potential value, even if the potential of the relating places for which the potential has been estimated has not yet been actually measured, the potential measurement condition determining means 3 does not output the instruction of the potential measurement for those places, but outputs the instruction of the potential measurement for the place which is at a further input side and which has an unknown potential. Therefore, the execution time can be shortened in comparison with the case in which all of necessary potentials are obtained by an actual potential measurement.

In this connection, when the potential of the place relating to the defective cause place is estimated, there is a case that the estimated potential value is in error. In this case, the estimation error correcting means 4 detects the existence of the error as the contradiction, and excludes the related estimated potential value so as to correct the error. The defective cause place deriving means 5 can correctly identify a range of candidates of defective cause places on the basis of the corrected estimated potential values.

Incidentally, in FIG. 1, if the LSI defective automatic analysis system 10 is considered as a computer, the above mentioned processing can be executed by storing the above mentioned processing as a program in the recording medium 6.

As mentioned above, according to the present invention, even if neither information of circuit connection of the LSI to be analyzed, nor without information of logical desired values when a test signal is applied, is obtained, it is advantageous to be capable of automatically searching for a defective cause place in the LSI for a shortened execution time.

What is claimed is:

1. An LSI defective automatic analysis system including a potential measuring means for applying a series of predetermined test vectors to a designated sample selected from two samples consisting of a non-defective LSI and a defective LSI both based on the same design, and for measuring an operating potential of a designated place on a surface of the LSI chip at the moment a designated test vector is applied; a potential estimating means receiving another measured potential value already obtained, for estimating, in the same sample, the potential of another place or the potential when another test vector is applied; and a potential measurement condition determining means receiving the measured potential value and the estimated potential value already obtained, for instructing the sample to be measured, the place to be measured and the test vector to be applied, as the condition for the potential measurement required to search for a defective cause place.

2. An LSI defective automatic analysis system claimed in claim 1, further including an estimation error correcting means receiving the measured potential value and the estimated potential value, for detecting the contradiction between the measured and estimated potential values, and for correcting an error of the related potential estimation when the contradiction is detected; and a defective cause place deriving means receiving the measured potential value and the estimated potential value, for deriving a range of candidates of defective cause places in the defective sample.

3. An LSI defective automatic analysis method including a potential measuring step for applying a series of predetermined test vectors to a designated sample selected from two samples consisting of a non-defective LSI and a defective LSI both based on the same design, and for measuring an operating potential of a designated place on a surface of the LSI chip at the moment a designated test vector is applied; a potential estimating step receiving another measured potential value already obtained, for estimating, in the same sample, the potential of another place or the potential with another test vector is applied; and a potential measurement condition determining step receiving the measured potential value and the estimated potential value already obtained, for instructing the sample to be measured, the place to be measured and the test vector to be applied, as the condition for the potential measurement required to search for a defective cause place.

4. An LSI defective automatic analysis method claimed in claim 3, further including an estimation error correcting step receiving the measured potential value and the estimated potential value, for detecting the contradiction between the measured and estimated potential values, and for correcting an error of the related potential estimation when the contradiction is detected; and a defective cause place deriving step receiving the measured potential value and the estimated potential value, for deriving a range of candidates of defective cause places in the defective sample.

5. A recording medium storing a program for causing a computer to execute a potential measuring step for applying a series of predetermined test vectors to a designated sample selected from two samples consisting of a non-defective LSI and a defective LSI both based on the same design, and for measuring an operating potential of a designated place on a surface of the LSI chip at the moment a designated test vector is applied; a potential estimating step receiving another measured potential value already obtained, for estimating, in the same sample, the potential of another place or the potential with another test vector is applied; and a potential measurement condition determining step receiving the measured potential value and the estimated potential value already obtained, for instructing the sample to be measured, the place to be measured and the test vector to be applied, as the condition for the potential measurement required to search for a defective cause place.

6. A recording medium claimed in claim 5, further including an estimation error correcting step receiving the measured potential value and the estimated potential value, for detecting the contradiction between the measured and estimated potential values, and for correcting an error of the related potential estimation when the contradiction is detected; and a defective cause place deriving step receiving the measured potential value and the estimated potential value, for deriving a range of candidates of defective cause places in the defective sample.

* * * * *